(12) United States Patent
Ryu et al.

(10) Patent No.: US 11,100,852 B2
(45) Date of Patent: Aug. 24, 2021

(54) DISPLAY DEVICE

(71) Applicant: LG ELECTRONICS INC., Seoul (KR)

(72) Inventors: Seunghak Ryu, Seoul (KR); Sungyeon Cho, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/597,719

(22) Filed: Oct. 9, 2019

(65) Prior Publication Data

US 2020/0380913 A1 Dec. 3, 2020

(30) Foreign Application Priority Data

May 31, 2019 (WO) ............... PCT/KR2019/006576

(51) Int. Cl.
  *G09G 3/3208* (2016.01)
  *H01L 51/52* (2006.01)
  *H05K 5/00* (2006.01)
  *H05K 5/02* (2006.01)
  *H02M 3/00* (2006.01)

(52) U.S. Cl.
  CPC ....... *G09G 3/3208* (2013.01); *H01L 51/5203* (2013.01); *H01L 51/5237* (2013.01); *H05K 5/0017* (2013.01); *H05K 5/0247* (2013.01); *G09G 2310/08* (2013.01); *G09G 2320/0257* (2013.01); *G09G 2330/021* (2013.01); *H02M 3/00* (2013.01)

(58) Field of Classification Search
  CPC ............. G09G 3/3208; G09G 2310/08; G09G 2330/021; G09G 2320/0257; H01L 51/5237; H01L 51/5203; H05K 5/0017; H05K 5/0247; H02M 3/00
  See application file for complete search history.

(56) References Cited

U.S. PATENT DOCUMENTS

| 5,608,617 A | * | 3/1997 | Morrison | ............... | H02M 3/00 363/147 |
| 2018/0168060 A1 | | 6/2018 | Ryu | | |
| 2018/0212377 A1 | * | 7/2018 | Zimmermann | ...... | H05K 7/1487 |

(Continued)

FOREIGN PATENT DOCUMENTS

| KR | 20050078866 | 8/2005 |
| KR | 20060120721 | 11/2006 |

(Continued)

OTHER PUBLICATIONS

PCT International Application No. PCT/KR2019/006576, International Search Report dated Feb. 28, 2020, 3 pages.

*Primary Examiner* — Andrew Sasinowski
(74) *Attorney, Agent, or Firm* — Lee Hong Degerman Kang & Waimey

(57) ABSTRACT

The present invention relates to a display device of separated type in which a panel and a main board are spaced apart from each other. The display device includes a display body including a panel, a housing spaced apart from the display body to transmit or receive a signal to or from the display body, and a cable configured to connect the display body and the housing, wherein the display body further includes a converter configured to converter power supplied from the housing via the cable into driving power for the panel.

13 Claims, 8 Drawing Sheets

(56) References Cited

U.S. PATENT DOCUMENTS

| | | | |
|---|---|---|---|
| 2019/0014200 A1* | 1/2019 | Cho | G06F 1/1643 |
| 2019/0073980 A1* | 3/2019 | Cheng | G09G 3/3688 |
| 2019/0122812 A1* | 4/2019 | Jin | H02M 3/00 |
| 2019/0157910 A1* | 5/2019 | Choi | H02M 7/53871 |
| 2019/0206297 A1* | 7/2019 | Dong | G09G 3/20 |

FOREIGN PATENT DOCUMENTS

| | | | |
|---|---|---|---|
| KR | 100852621 | 8/2008 | |
| KR | 20180009175 | 1/2018 | |
| WO | WO-2005076600 A1 * | 8/2005 | H04N 5/44 |

\* cited by examiner

FIG. 3
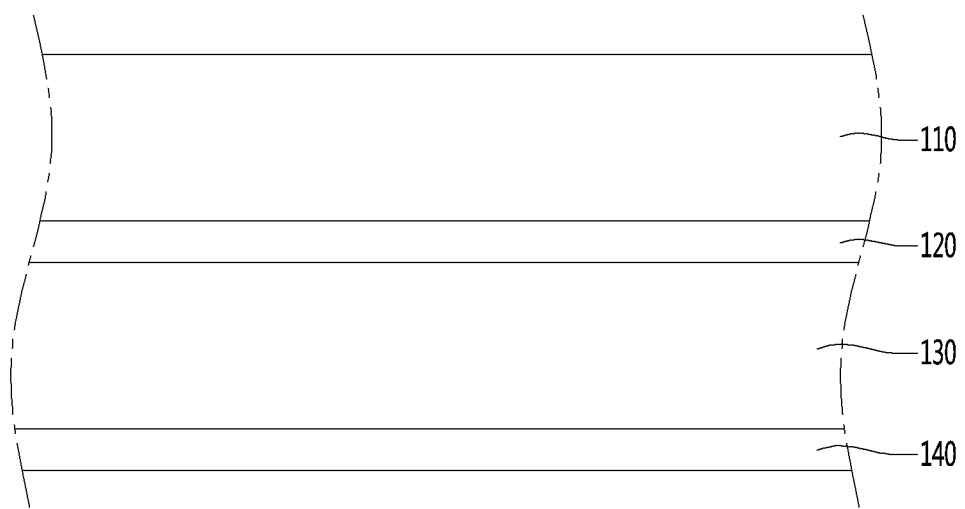
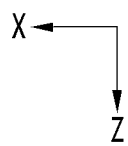

| CHANNEL OPERATION | Load |
|---|---|
| 1ch | 1A ~ 7A |
| 2ch | 7A ~ 20A |
| 3ch | 20 ~ 25A |
| 4ch | 25 A OR MORE |

DISPLAY DEVICE

CROSS-REFERENCE TO RELATED APPLICATIONS

Pursuant to 35 U.S.C. § 119 (a), this application claims the benefit of an earlier filing date and right of priority to International Application No. PCT/KR2019/006576, filed on May 31, 2019, the contents of which are hereby incorporated by reference herein in its entirety.

BACKGROUND

1. Field of the Invention

The present invention relates to a display device, and more particularly, to a display device of separated type in which a panel and a main board are capable of being disposed apart from each other.

2. Discussion of the Related Art

With technological advances, various types of display devices have been developed, such as a liquid crystal display (LCD), a plasma display panel (PDP), an electro luminescent display (ELD), a vacuum fluorescent display (VFD), an organic light emitting diode (OLED) display.

Among them, a display device using OLEDs is superior in luminance characteristics and viewing angle characteristics to a liquid crystal display device, and has an advantage that it can be realized as an ultra-thin type because it does not require a backlight unit.

In recent years, a display device has been developed in which a panel is separated from a main board and the panel such that the panel is closely attached to a wall as a frame. In such a display device, the panel and the main board are connected by a cable, and an image signal and power may be transmitted from the main board to the panel through the cable.

In this case, there is a restriction that the length of the cable is realized to be less than a predetermined length due to a problem of signal loss or power loss, or the thickness of the cable is realized to be more than a predetermined thickness.

SUMMARY OF THE INVENTION

The present invention provides a display device that minimizes design constraints of a cable connected between a display body having a panel and a housing having a main board.

More specifically, the present invention provides a display device that connects a display body and a housing with a thinner and longer cable.

According to one aspect of the present invention, a display device comprises a display body including a panel, a housing spaced apart from the display body to transmit or receive a signal to or from the display body, and a cable configured to connect the display body and the housing, wherein the display body further includes a converter configured to converter power supplied from the housing via the cable into driving power for the panel.

The housing supplies power to the display body at a first voltage, and the converter converts the first voltage into a second voltage lower than the first voltage and supplies power to the panel at the second voltage.

The first voltage is 35 V or more, and the second voltage is in a range of 20 V or more to 25 V or less.

The first voltage is 50 V or more.

The housing includes a power supply unit configured to supply power to the display body, a control unit configured to allow an input image to be output to the panel, and a housing connector connected to the cable.

The power supply unit boosts voltage of power supplied to the display body to a voltage which is higher than a driving voltage of the panel and supplies boosted voltage to the housing connector.

The display body further includes a body connector connected to the cable to receive power and an image signal, and a timing controller configured to receive power obtained through conversion by the converter and the image signal.

The converter performs conversion of power through Pulse Width Modulation (PWM) control.

The converter is formed with a plurality of channels to which converted power is output. The plurality of channels formed in the converter selectively operate according to a load of the panel.

A single channel operates when a current supplied to the panel is less than a reference current, and two channels operate in an interleaved scheme when the current supplied to the panel is equal to or greater than the reference current.

The housing further includes a memory configured to store a table in which ranges of a current supplied to the panel are mapped to numbers of operating channels.

The display body includes a plurality of converters.

The converter includes at least one coil.

When the converter includes a plurality of coils connected in series to one another, the plurality of coils are arranged not to be side-by-side to one another.

BRIEF DESCRIPTION OF THE DRAWINGS

FIG. 3 is a cross-sectional view of an OLED panel according to an embodiment of the present invention.

DETAILED DESCRIPTION OF THE PREFERRED EMBODIMENTS

Hereinafter, the present invention will be described in detail with reference to the drawings.

The suffixes "unit" for components used in the description below are assigned or mixed in consideration of easiness in writing the specification and do not have distinctive meanings or roles by themselves.

A display device according to an embodiment of the present invention may include a display body 10 (see FIG. 1) including a panel, a housing 400 (see FIG. 5) for transmitting and receiving signals to and from the display body 10, and a cable 500 connecting the display body 10 and the housing 400.

Although description is given as taking, as an example, a case in which the panel is an OLED panel, the panel applicable to the present invention is not limited to the OLED panel, and may be a liquid crystal display device (LCD), a plasma display panel (PDP), a field emission display (FED), or the like.

First, the display body according to an embodiment of the present invention will be described below with reference to FIGS. 1 to 4.

Figure 1:
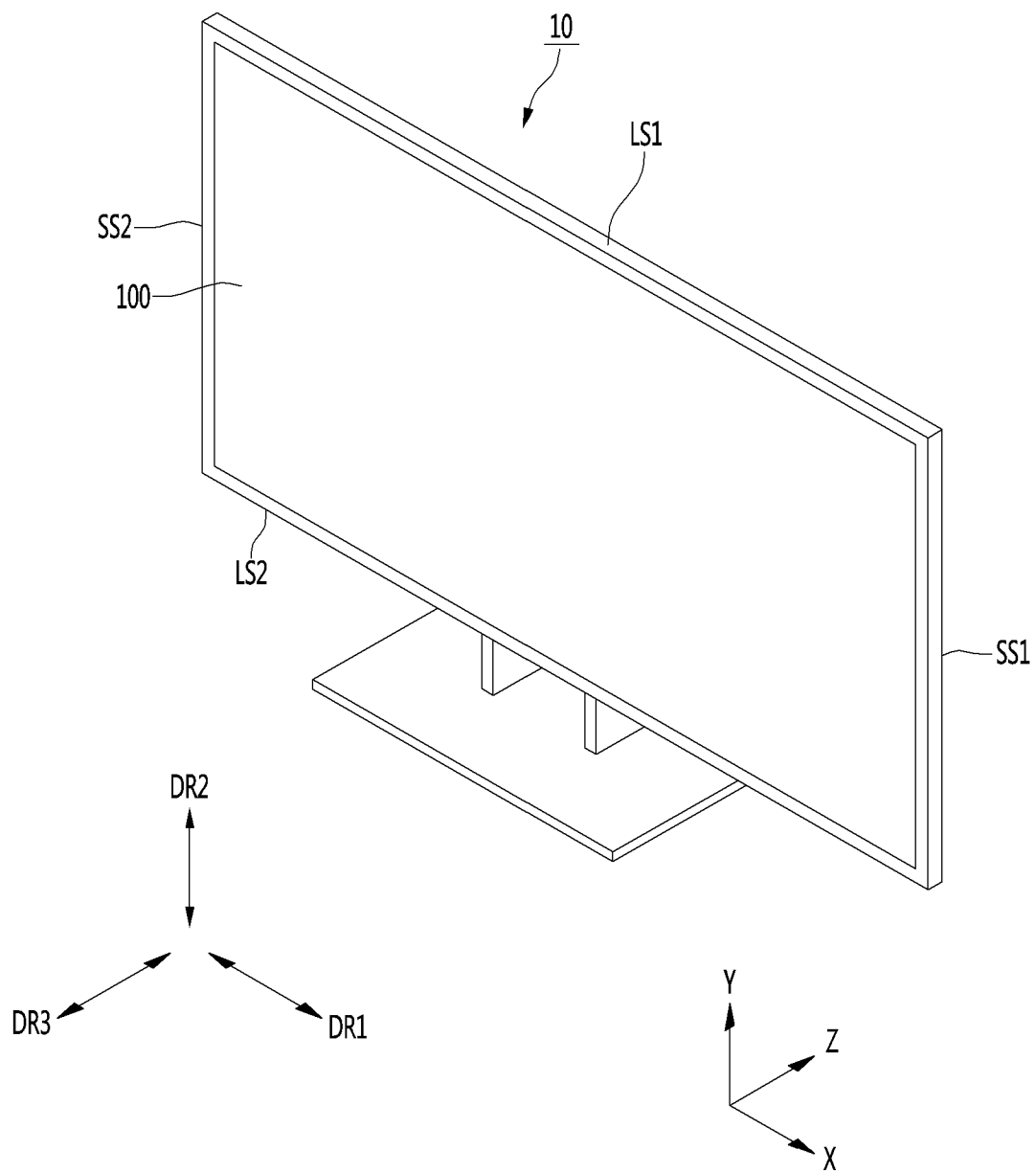
FIG. 1 is a perspective view showing a display body of a display device according to an embodiment of the present invention.

FIG. 1 is a perspective view showing a display body of a display device according to an embodiment of the present invention.

The display body 10 may include a panel 100 on which a screen is displayed.

As shown in FIG. 1, the panel 100 may include a first long side LS1, a second long side LS2 opposite to the first long side LS2, a first short side SS1 adjacent to the first long side LS1 and the second long side LS2, and a second short side SS2 opposite to the first short side SS1.

Herein, the first short side SS1 may be referred to as a first side area, the second short side SS2 may be referred to as a second side area opposite to the first side area, the first long side area LS1 may be referred to as a third side area adjacent to the first side area and the second side area and located between the first side area and the second side area, and the second long side area LS2 may be referred to as a fourth side area adjacent to the first side area and the second side area, located between the first side area and the second side area, and opposite to the third side area.

Although the lengths of the first and second long sides LS1 and LS2 are longer than the lengths of the first and second short sides SS1 and SS2 according to the convenience of the description, the lengths of the first and second long sides LS1 and LS2 may be substantially equal to the lengths of the first and second short sides SS1 and SS2.

In the following description, a first direction DR1 is a direction parallel to the long sides LS1 and LS2 of the panel 100 and a second direction DR2 is a direction parallel to the short side SS1 and SS2).

A third direction DR3 may be a direction perpendicular to the first direction DR1 and/or the second direction DR2.

The first direction DR1 and the second direction DR2 may collectively be referred to as a horizontal direction. In addition, the third direction DR3 may be referred to as a vertical direction.

The display body 10 is shown as being supported by a stand in FIG. 1, but this is for illustrative purposes only for convenience of the description and therefore, is not limited thereto. That is, the display body 10 may be installed in such a manner that it is in close contact with a wall or the like.

Figure 2:
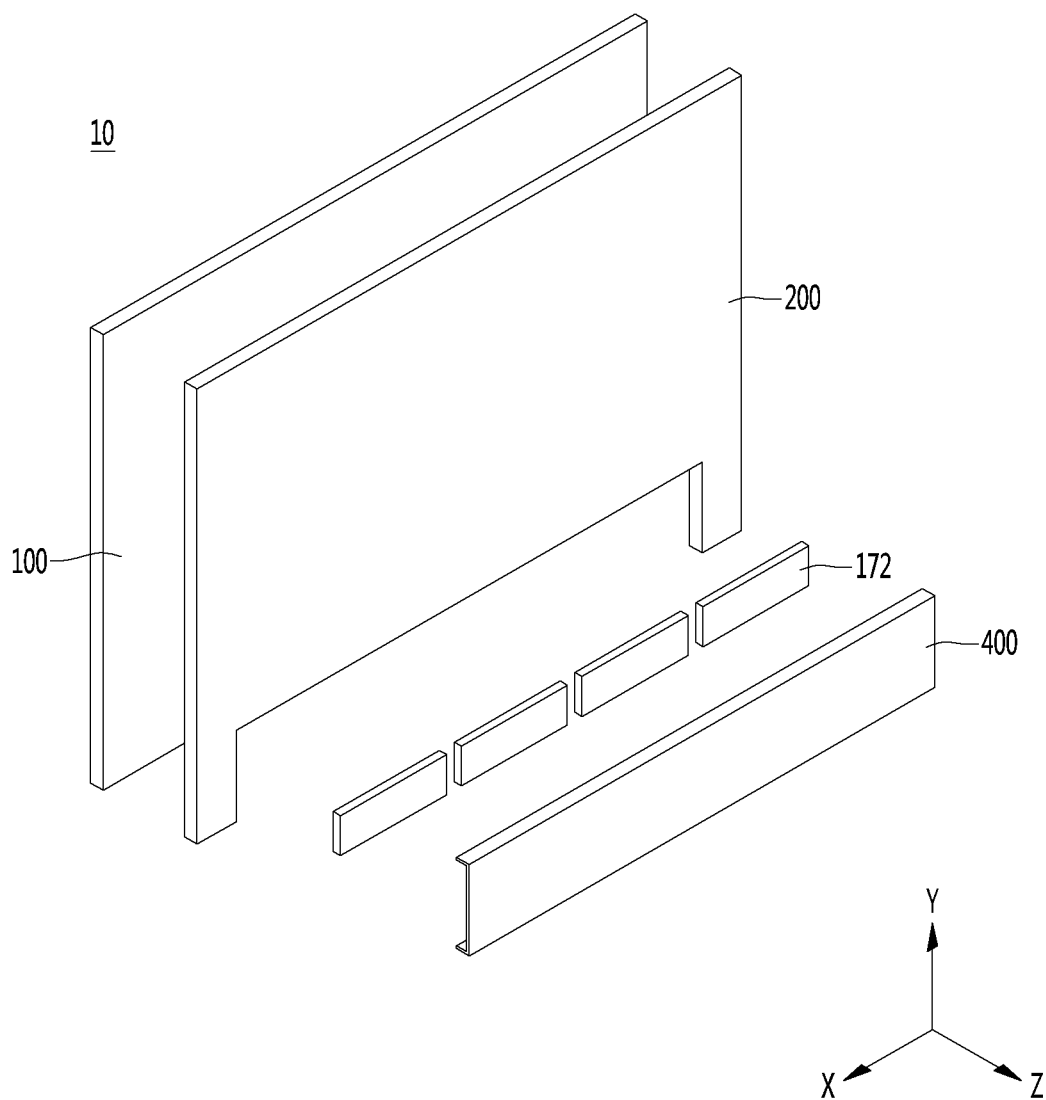
FIG. 2 is an exploded perspective view showing a portion of the display body of FIG. 1.

FIG. 2 is an exploded perspective view showing a portion of the display body of FIG. 1.

As shown in FIG. 2, the display body 10 may include a panel 100, a module cover 200, and a PCB cover 400.

The panel 100 is provided on the front surface of the body 10 and images may be displayed thereon. The panel 100 may output an image by dividing the image into a plurality of pixels and controlling the color, brightness, and saturation of each pixel to emit light.

The panel 100 may have a rectangular shape. However, the present invention is not limited thereto, and the panel 100 may have a shape having a predetermined curvature at corners. The panel 100 may be an organic light emitting diode (OLED) panel. However, the present invention is not limited thereto, and the panel 100 may be a liquid crystal display panel.

The module cover 200 may be provided on the rear surface of the panel 100. The module cover 200 may be attached directly to the panel 100. The module cover 200 may support the rear surface of the panel 100. That is, this means that the module cover 200 may reinforce the rigidity of the panel 100. Accordingly, the module cover 200 may include a lightweight and high-strength material. For example, the module cover 200 may include aluminum.

A source PCB 172 may be attached to a lower region of the module cover 200. The module cover 200 may have a hole or a depression in an area where the source PCB 172 is located to secure an area where the source PCB 172 is to be positioned. When the module cover 200 is formed with too many holes or the depression is formed too large, the module cover 200 may be cracked or the rigidity thereof may be weakened. Accordingly, it is preferable that the module cover 200 is formed with a small number of holes or a small depression.

On the source PCB 172, signal wires for transmitting timing control signals and pieces of digital video data transmitted from the timing controller may be may be disposed. The source PCB 172 may transmit a signal to the panel 100 according to the image data and the timing control signal transmitted from the timing controller 15.

The source PCB 172 may be connected to the panel 100 by a source COF (Chip On Film).

The source COF may be electrically connected to the source PCB 172 and data pads of the panel 100. The source COF may be mounted with a data integrated circuit.

A PCB cover 400 may be provided on the rear side of an area where the source PCB 172 is located. The PCB cover 400 may prevent the source PCB 172 from being exposed to the outside. The PCB cover 400 may be opaque such that the source PCB 172 is not exposed to the outside.

The PCB cover 400 may include an insulating material such that the source PCB 172 is not interfered with by other electronic devices. For example, the PCB cover 400 may include a plastic material. Accordingly, the PCB cover 400 may protect the source PCB 172 from a leakage current.

The body 10 of the display device according to the present invention may support the panel 100 only with the module cover 200. In other words, the body 10 may not have other covers than the module cover 200. Accordingly, the user may feel that the thickness of the body 10 is very thin, and may be caused to concentrate more on a display screen.

FIG. 3 is a cross-sectional view of an OLED panel according to an embodiment of the present invention.

Referring to FIG. 3, the panel 100 may include a transparent substrate 110, an upper electrode 120, an organic light emitting layer 130, and a lower electrode 140. The transparent substrate 110, the upper electrode 120, the organic light emitting layer 130, and the lower electrode 140 may be sequentially formed.

The transparent substrate 110 and the upper electrode 120 may include a transparent material. The lower electrode 140 may include a material that is not transparent. However, it is not limited thereto, and the lower electrode 140 may include a transparent material (for example, ITO or the like). In this case, light may be emitted to one surface of the lower electrode 140.

When a voltage is applied to the upper and lower electrodes 120 and 140, light emitted from the organic light emitting layer 130 may pass through the upper electrode 120 and the transparent substrate 110 to exit to the outside. In this case, a light shielding plate may be further formed behind the lower electrode 140 to allow light emitted to the lower electrode 140 to exit to the front surface.

The display device 100 according to the present invention may be an OLED display device. Accordingly, a separate light source is not required, thereby reducing the volume and weight of the display device 100. In addition, the OLED display device has a response speed that is 1000 times faster than that of the liquid crystal display device, so that no afterimage may remain when an image is displayed.

Figure 4:
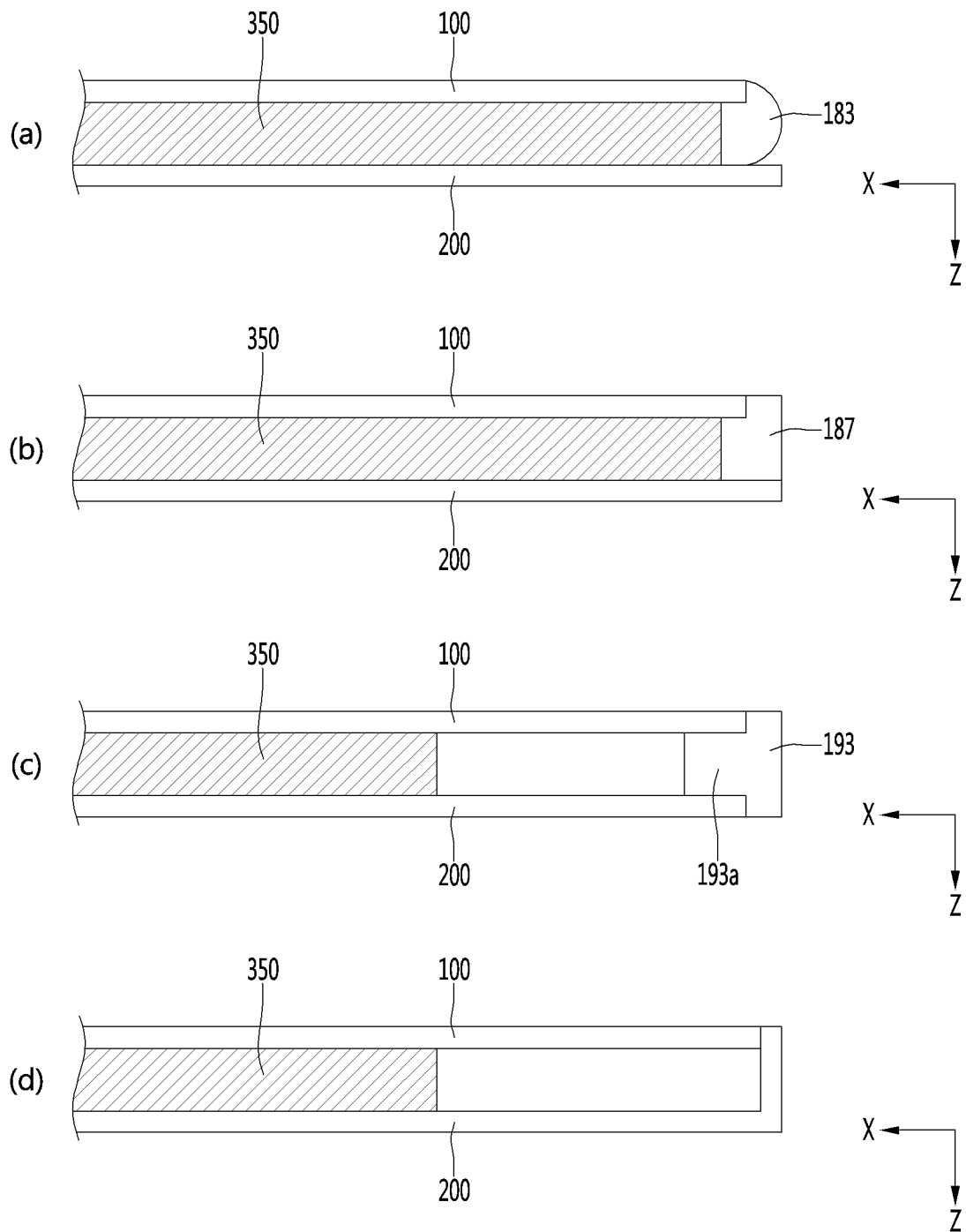
FIG. 4 is a cross-sectional view of a display body according to various embodiments of the present invention.

FIG. 4 is a cross-sectional view of a display body according to various embodiments of the present invention.

Referring to FIG. 4, in the display device according to the present invention, the panel 100 and a back cover 200 may be attached to each other through an adhesive sheet 350. The adhesive sheet 350 may include a double-sided tape having both sides capable of providing an adhesive force.

The adhesive sheet 350 may have a different thickness. Accordingly, foreign matters or dust may be introduced between the panel 100 and the back cover 200. In order to prevent this, as shown in (a) of FIG. 4, a sealing member 183 may be side-sealed to at least one side of the adhesive sheet 350. The sealing member 183 may simultaneously shield the adhesive sheet 350 and the panel 100 at at least one side.

As another example, a frame 187 may be inserted into at least one side of the adhesive sheet 350, as shown in (b) of FIG. 4. The frame 187 may abut at least one side of the adhesive sheet 350 and may be bent such that one end thereof extends toward the panel 100. Accordingly, at least one side of the panel 100 may be shielded at the same time.

As another example, a middle cabinet 193 may be disposed between the panel 100 and the back cover 200, as shown in (c) of FIG. 4. The middle cabinet 193 may guide positions where the panel 100 is coupled. The middle cabinet 193 may have a flange 193a inserted between the panel 100 and the back cover 200. The middle cabinet 193 may have a body portion that simultaneously shield the panel 100 and the back cover 200 at at least one side.

The flange 193a of the middle cabinet 193 may be spaced apart from the adhesive sheet 350. Accordingly, since the adhesive sheet 350 does not need to be entirely located on the panel 100, the amount of the adhesive sheet 350 necessary to manufacture the display device may be reduced.

As another example, an edge portion of the back cover 200 may be bent toward the panel 100, as shown in (d) of FIG. 4. Since the edge portion of the back cover 200 is bent, at least one side of the adhesive sheet 350 may be shielded from the outside.

In this case, other substances may not be included between the panel 100 and the back cover 200. Thus, the manufacturing process of the display device is simplified, thereby saving cost. Further, the edges of the back cover 200 may be spaced apart from the adhesive sheet 350. Accordingly, the adhesive sheet 350 does not need to be entirely positioned on the panel 100, thereby reducing the amount of the adhesive sheet 350 necessary to manufacture the display device.

In the following embodiments, structures located on sides of the adhesive sheet 350 are omitted for convenience of description. The structures positioned on the sides of the adhesive sheet 350 are applicable to other embodiments.

Figure 5:
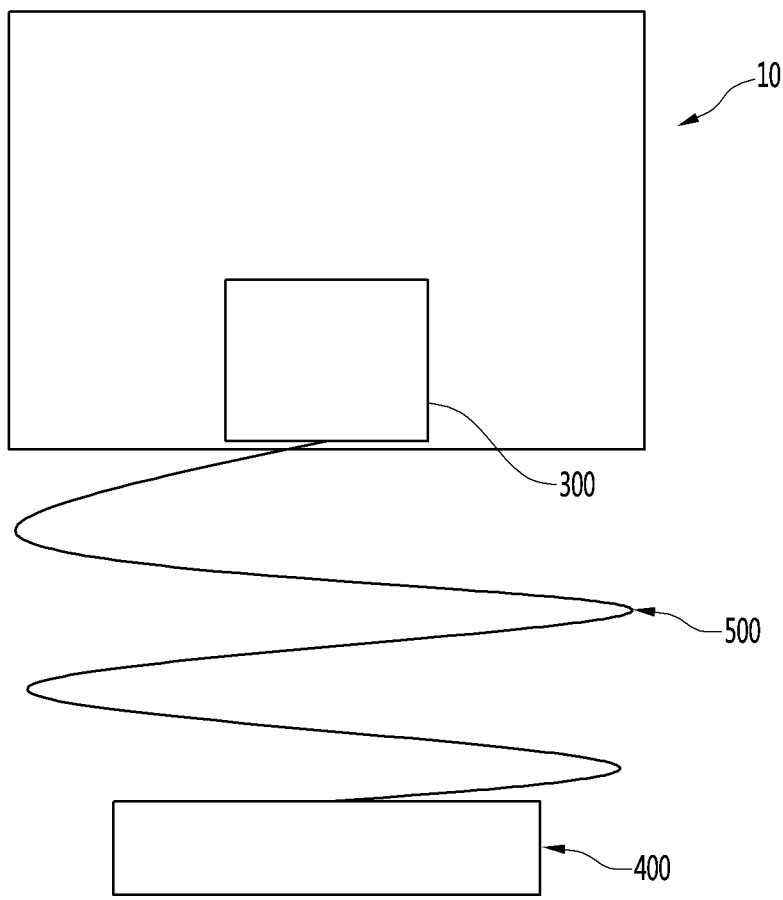
FIG. 5 is a schematic view showing a configuration of a display device according to an embodiment of the present invention.

FIG. 5 is a schematic view showing a configuration of a display device according to an embodiment of the present invention.

The display device may include a display body 10, a housing 400 spaced apart from the display body 10, and a cable 500 for transmitting and receiving signals between the display body 10 and the housing 400.

The display body 10 may be electrically connected to the housing 400 through the cable 500.

The housing 400 may transmit at least one signal to the display body 10. The housing 400 may shield components that drive the display device. For example, the housing 400 may shield at least one printed circuit board (PCB), such as a main board or the like.

The housing 400 may be spaced apart from the display body 10. That is, it means that the housing 400 may not be positioned on a portion in which a screen is displayed. In this case, the user may focus more on an image displayed on the screen, and the display body 10 may be made thinner.

Figure 6:
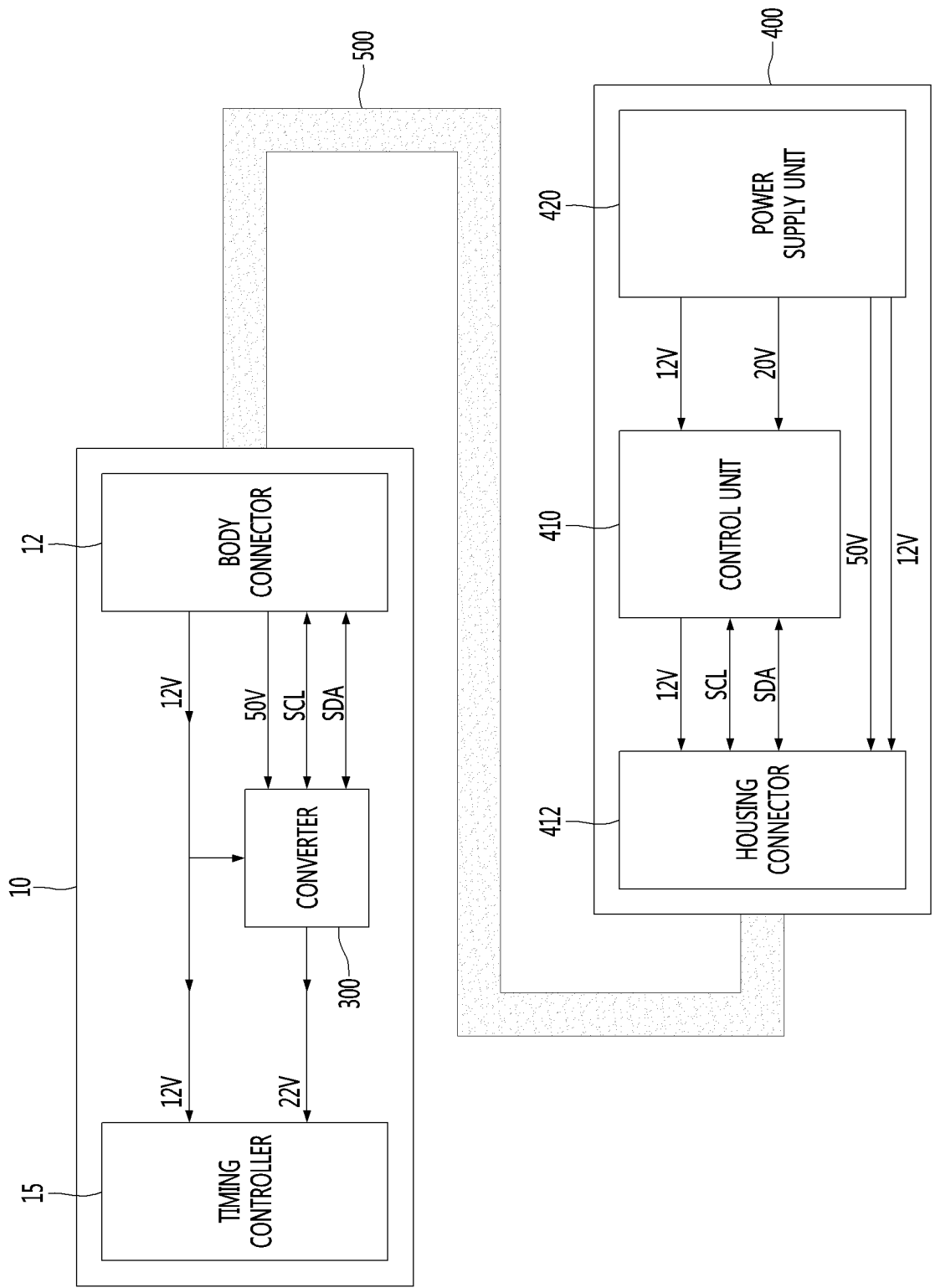
FIG. 6 is a control block diagram of a display device according to an embodiment of the present invention.

FIG. 6 is a control block diagram of a display device according to an embodiment of the present invention.

In FIG. 6, only a configuration necessary for describing the operation of the display device is shown, and the display body 10 and the housing 400 according to an embodiment of the present invention may further include a configuration other than the configuration shown in FIG. 6, and some configurations may be omitted.

The display body 10 may include a body connector 12 connected to the cable 500, a timing controller 15 that transfers a signal input through the body connector 12 to the panel 100, and a converter 300 that converts power supplied to the body connector 12 to driving power of the panel 100.

The body connector 12 is connected to the housing 400 through the cable 500 and may receive power and image signals from the housing 400 through the cable 500.

The cable 500 may be an integrated cable capable of transmitting and receiving both power and image signals.

For example, the cable 500 may include a signal line, a power line, a ground line, a shield layer, and the like.

The signal line may include a control signal line for transmitting and receiving signals for controlling at least one component included in the display body 10, a data signal line for transmitting and receiving a image signal, and the like.

The power line may include a first power line for supplying power necessary for operation of at least one component included in the display body 10, a second power line for supplying power to be provided to the panel 100, and the like.

The ground line and the shield layer may be formed separately. Alternatively, the shield layer may be formed also as a ground line at the same time, and in this case, there is an advantage that the thickness of the cable 500 may be designed to be thinner.

The timing controller 15 may transfer the image signal inputted through the housing 400 to the panel 100. The timing controller 15 may transfer, to the source PCB 172, the timing signals CLK, LOAD, and SPi for controlling the source PCB 172 and the video signals R, G, and B The timing controller 15 may control an image displayed on the panel 100 through the source PCB 172.

The timing controller 15 may be disposed around the source PCB 172. For example, the timing controller 15 may be disposed on the top of the source PCB 172. The timing controller 15 may be disposed on the rear side of the panel 100. The timing controller 15 may be coupled to the source PCB 172.

A driving IC for transmitting and receiving data between the source PCB 172 and the housing 400 may be mounted on the timing controller 15. For example, the driving IC may be an SERDES (serializer/deserializer) IC. The SERDES IC may convert serial data/parallel data to be transmitted and received in the chip, into parallel data/serial data. As a result, the SERDES IC ma speed up signal transmission. However, this is merely an example, and the driving IC for transmitting and receiving data between the source PCB 172 and the housing 400 may be mounted on the source PCB 172.

The converter 300 may convert power supplied from the housing 400 via the cable 500 into driving power of the panel 100.

The converter 300 may receive power through the body connector 12 and step down the input power to a driving voltage of the panel 10 supply the voltage to the timing controller 15.

The timing controller 15 may receive the power which is obtained through conversion by the converter 300 and an image signal from the converter 300.

The timing controller 15 may supply stepped-down power and image signals to the panel 100.

A detailed description of the converter 300 will be described later with reference to FIG.

The housing 400 may include a control unit 410 that allows an input image to be output to the panel 100, a housing connector 412 connected to a cable, and a power supply unit 420 that supplies power to the display body 10.

The housing 400 may include a main board on which the control unit 410 is mounted, and the main board may provide an interface for the display device to operate.

The housing connector 412 is connected to a cable 500 connected to the display body 10 and the housing connector 412 may transmit power and image signals to the display body 10 through the cable 500.

The housing connector 412 may transmit the video signal received from the control unit 410 and the power received from the power supply unit 420 to the display body 10.

The power supply unit 420 may convert AC power, that is commercial power, into DC power to provide power required for the operation of the display device.

For example, the power supply unit 420 may supply power (for example, 20 V) required for the operation of the control unit 410 and power (for example, 12 V) required for the control unit 410 to drive the housing connector 412 to the control unit 410.

The power supply unit 420 may supply power (for example, 12 V or 50 V) required to drive the display body 10 to the housing connector 412 and the housing connector 412 may transfer the power to the display body 10 via the cable 500.

The display body 10 may require power for driving the panel 100, the timing controller 15, and the like. In this case, a driving voltage of the panel 100 may be different from a voltage required by the timing controller 15 or the like. For example, the panel 100 is driven by power of about 22 V, and the timing controller 15, the converter 300 or the like may be driven by power of about 12 V, but this is merely exemplary and not limited thereto. The housing 400 may transfer power for driving the panel 100 and power for operating the other components via the cable 500, respectively.

According to one embodiment, the housing 400 may transmit the driving voltage of the panel 100 when the power for driving the panel 100 is transmitted to the display body 10. In this case, the maximum length of the cable 500 may be 2 m.

According to another embodiment, when the housing 400 transmits power for driving the panel 100 to the display body 10, the power is transmitted to the display body 10 at a voltage higher than the driving voltage of the panel 100. The converter 300 of the display body 10 may step down the power voltage supplied from the housing 400 to the driving voltage of the panel 100 and then supply the driving voltage to the panel 100.

In this case, even when a voltage drop occurs in the cable 500, it is possible to convert the power to the driving voltage of the panel 100, thereby designing a length of the cable 500 to be relatively long.

In addition, when the voltage transmitted via the cable 500 is high, it is possible to reduce the amount of current, thereby designing a thickness of the cable 500 to be relatively thin. Specifically, assuming that power of 600 W is transmitted through the cable 500, the cable 500 may be designed such that a current of about 27.3 A flows when a power voltage of 22 V is transmitted via the cable 500, and a current of about 12 A flows when a power voltage boosted to 50 V is transmitted via the cable 500. That is, when the boosted power is supplied to the cable 500, there is an advantage that the thickness of the cable may be designed to be much thinner.

Next, a method of converting power in the converter 300 according to an embodiment of the present invention will be described with reference to FIG. 7.

Figure 7:
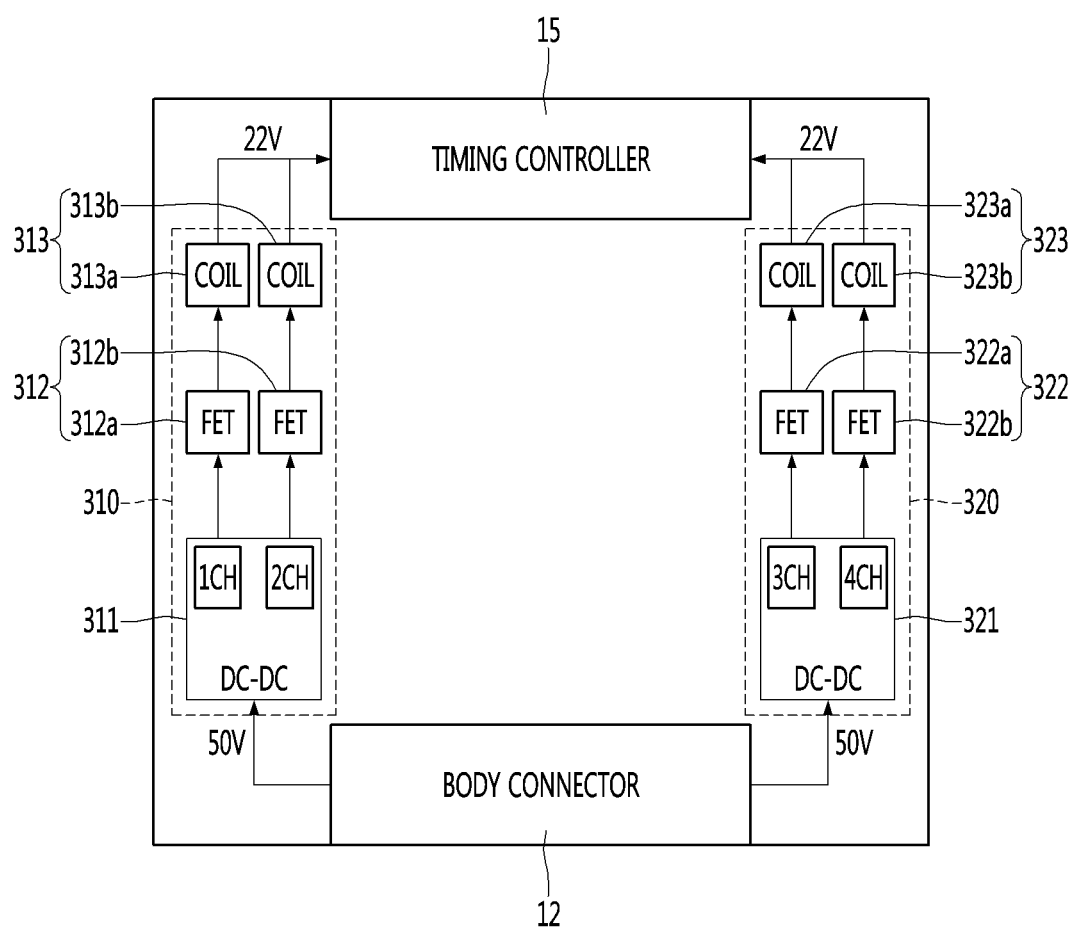
FIG. 7 is a block diagram describing a method of operating a converter according to an embodiment of the present invention.

FIG. 7 is a block diagram describing a method of operating a converter according to an embodiment of the present invention.

The body connector 12 may supply power supplied from the housing 400 via the cable 500 to at least one of the converter 300 and the timing controller 15.

For example, the body connector 12 may be supplied with power of 12V and power of 50V from the cable 500, the power of 12V may be supplied to the timing controller 15 and the converter 300, and the power of 50V may be supplied to the converter 300. Herein, the power of 12V may be power consumed for the timing controller 15 and the converter 300 to operate. The power of 50V may be power to be stepped down in order to be used to drive the panel 100.

The display body 10 may include at least one converter 300. In the example of FIG. 7, the display body 10 is shown as including a first converter 310 and a second converter 320, but this is merely exemplary. That is, the display body 10 may include only one converter, or may include two or more converters.

For example, the first and second converters 310 and 320 may convert voltages through PWM (Pulse Width Modulation) control.

Specifically, the first converter 310 may include a DC-DC controller 311, a transistor 312, and a coil 313, and the second converter 320 may include a DC-DC controller 321, a transistor 322, and a coil 323.

The DC-DC controllers 311 and 321 may step down a voltage of power input from the body connector 12. For example, the DC-DC controllers 311 and 321 may generate and apply driving pulses to the transistors 312 and 322, which complementarily turn on and off the transistors 312 and 322. A constant current flows through the coils 313 and 323 in accordance with the on and off states of the transistors 312 and 322 and may be transferred to the timing controller 15.

Meanwhile, the first and second converters 310 and 320 shown in FIG. 7 are merely illustrative. In other words, the first and second converters 310 and 320 may be formed and controlled in various forms capable of stepping down a voltage.

Meanwhile, each of the first and second converters 310 and 320 may be formed of a multi-channel structure. That is, each of the first and second converters 310 and 320 may be formed with a plurality of channels through which the power obtained through conversion is output.

Referring to the example of FIG. 7, first and second channels for outputting power may be formed in the first converter 310 and third and fourth channels for outputting power may be formed in the second converter 320. The first channel may be formed by a first output terminal of the first DC-DC controller 311, a first transistor 312a and a first coil 313a, the second channel may be formed by a second output terminal of the first DC-DC controller 311, a second transistor 312b, and a second coil 313b, the third channel may be formed by a first output terminal of the second DC-DC controller 321, a third transistor 322a and a third coil 323a, and the fourth channel may be formed by a second output terminal of the second DC-DC controller 322, a fourth transistor 322b and a fourth coil 323b.

Power may be output from the first to fourth channels at the same voltage.

Each of the first through fourth transistors 312a, 312b, 322a, and 322b may include a high-side transistor and a low-side transistor.

However, the number of channels is only exemplary, and one channel or two or more channels may be formed in each of the converters 300.

Meanwhile, the thickness of the display body 10 may be determined by the thicknesses of the coils 313a, 313b, 323a, and 323b.

According to one embodiment, each of the coils 313a, 313b, 323a, and 323b may be composed of one coil having a predetermined capacity (for example, 15 uH).

According to another embodiment, each of the coils 313a, 313b, 323a, and 323b may be formed in such a way that a plurality of (e.g., three) coils having a capacity (e.g., 4.7 uH) smaller than the predetermined capacity (for example, 15 uH) are connected in series.

This is for the purpose of solving the problem that the thickness of the display body 10 becomes too thick due to the thickness of the coil having a predetermined capacity being too thick to minimize the thickness of the display body 10 by serially connecting thinner coils. As described above, there is an advantage that the thickness of the display body 10 may be minimized by serially connecting a plurality of coils having a smaller capacity than the coil having the predetermined capacity required to supply the driving voltage to the panel 100.

Meanwhile, according to one embodiment, when the converter 300 includes a plurality of coils connected in series, the plurality of coils may be arranged to be side-by-side in the horizontal direction.

According to another embodiment, when the converter 300 includes a plurality of coils connected in series, the plurality of coils may be arranged not to be side-by-side in the horizontal direction. When the plurality of coils are arranged not to be side-by-side in the horizontal direction, there is an advantage that the heat radiating effect is improved as compared with the case where the plurality of coils are arranged to be side-by-side in the horizontal direction.

The timing controller 15 may supply power supplied from at least one of the first and second converters 310 and 320 to the panel 100.

The power supply unit 420 may step up (boost) the voltage of the power supplied to the display body 10 to be higher than the driving voltage of the panel 100 and supply the voltage to the housing connector 412. The housing connector 412 may supply the power supplied from the power supply unit 420 to the display body 10 via the cable 500. The converter 300 may step down the stepped-up power supplied via the cable 500 to supply the same to the panel 100.

That is, the housing 400 may supply power to the display body 10 at a first voltage, and the converter 300 may convert the first voltage supplied from the housing 400 to a second voltage lower than the first voltage, and supply power to the panel 100 at the second voltage.

The second voltage may be a driving voltage of the panel 100.

The first voltage may be greater than the second voltage. For example, the first voltage may be 35V or more, and the second voltage may be in a range of 20 V or more to 25 V or less. When the housing 400 supplies power to the display body 10 with a voltage higher than the driving voltage of the panel 100, it is possible to supply power to the panel 100 at the driving voltage of the panel 100 even when a power drop occurs in the process of supplying power from the housing 400 to the display body 10. Thus, there is an advantage that it is possible to design the length of the cable 500 connecting the housing 400 and the display body 10 to be longer than that in a case where the housing 400 supplies power to the display body 10 at the driving voltage of the panel 100.

In particular, the first voltage may be at least twice the second voltage. For example, the first voltage may be 50V or more, and the second voltage may be in a range of 20 V or more to 25 V or less. When the power supplied to the display body 10 by the housing 400 is more than twice the driving voltage of the panel 100, there is an advantage that it is possible to design the thickness of the cable 500 to be thinner by about half or more since the amount of current flowing through the cable 500 decreases to about half the amount of current in a case where the housing 400 supplies power to the display body 10 at the driving voltage of the panel 100.

On the other hand, as described above, when the converter 300 is formed with multi-channels, there is an advantage that the efficiency of the converter 300 may be improved and the power consumption may be improved. Specifically, the control unit 410 has an advantage that the power consumption of the panel 100 may be reduced by adjusting the number of operation channels according to a load of the panel 100.

Figures 8, 9:
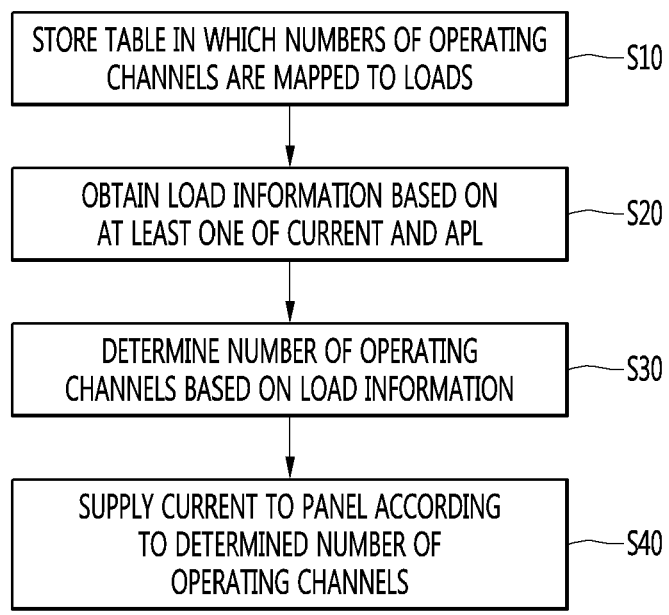
FIG. 8 is a flowchart describing a method of operating a display device according to an embodiment of the present invention.
FIG. 9 is an exemplary diagram showing a table in which the numbers of operation channels are mapped to loads according to an embodiment of the present invention.

FIG. 8 is a flowchart describing a method of operating a display device according to an embodiment of the present invention.

The control unit 410 may store a table in which the numbers of operation channels are mapped to loads (S10).

The housing 400 may further include a memory (not shown) for storing data necessary for operation of the display device. The memory (not shown) may store a table in which the numbers of operation channels are mapped to loads.

FIG. 9 is an exemplary diagram showing a table in which the numbers of operation channels are mapped to loads according to an embodiment of the present invention.

The load of the panel 100 may include a current supplied to the panel 100.

According to one embodiment, the memory (not shown) may store a table in which ranges of current supplied to the panel 100 are mapped to the numbers of operation channels. FIG. 9 is an exemplary diagram showing a case where the load of the panel 100 is a current supplied to the panel 100. Referring to FIG. 9, the memory (not shown) may store a table representing that, when the current supplied to the panel 100 is in a range of 1 A or more to less than 7 A, the number of operation channels is 1, when the current supplied to the panel 100 is a range of 7 A or more to less than 20 A, the number of operation channels is two, when the current supplied to the panel 100 is 25 A or more, the number of operation channels is four.

The table shown in FIG. 9 may vary depending on the maximum load required by the panel 100, and the maximum load required by the panel 100 may vary depending on the size of the panel 100. For example, the panel 100 having a size of 65 inch may have a maximum load of 15 A, and the panel 100 having a size of 77 inch may have a maximum load of 20 A.

Again, FIG. 8 will be described.

The control unit 410 may obtain load information based on at least one of the current and the APL (S20).

According to one embodiment, the control unit 410 may sense a current supplied to the panel 100 to obtain the load information.

Specifically, the display body 10 may further include a current sensing unit (not shown) for sensing a current supplied to the panel 100, and the current sensing unit (not shown) may transfer the sensed current to the control unit 410 via the body connector 12 and the cable 500. The control unit 410 may obtain the load information based on the current transferred from the display body 10.

According to another embodiment, the control unit 410 may obtain the load information by analyzing the APL of an image.

Specifically, the control unit 410 may obtain the APL by analyzing the data of an image signal, and convert the APL into the current, thereby obtaining the load information.

For example, when the APL is less than 25%, the load information representing that the current is in a range of 1 A or more to 7 A is obtained, when the APL is in a range of 25% or more to less than 50%, the load information representing that the current is in a range of 7 A or more to 20 A is obtained, when the APL is in a range of 50% or more to less than 75%, the load information representing that the current is in a range of 20 A or more to 25 A is obtained, and when the APL is 75% or more, the load information representing that the current is 25 A or more is obtained.

On the other hand, the APL may be determined according to an image mode (for example, a power saving mode, a sharp mode, etc.).

According to another embodiment, the control unit 410 may obtain the first current supplied to the panel 100, obtain the second current converted based on the APL of an image, and obtain the maximum of the first and second currents as the load information.

The control unit 410 may determine the number of operation channels according to the load information (S30).

For example, when the current supplied to the panel 100 is less than a reference current (for example, 7 A), the control unit 410 may determine the number of operation channels to be one, and when the current supplied to the panel 100 is equal to or greater than the reference current, may determine the number of operation channels to be two.

The controller 410 may supply a current to the panel 100 according to the determined number of operation channels (S40).

The control unit 410 may allow the channels formed in the converter 300 to operate alternately when there are a plurality of operation channels. For example, when the number of operation channels is two, the control unit 410 may control the converter 300 such that the two channels operate in an interleaved scheme. The interleaved scheme means a scheme in which two channels operate alternately.

Specifically, the control unit 410 may control the first and second channels in the interleaved scheme when the first and second channels in FIG. 6 are determined as the operation channels, and control the third and fourth channels in the interleaved scheme when the third and fourth channels in FIG. 6 are determined as the operation channels.

As described above, the plurality of channels formed in the converter 300 may be selectively operated according to the load of the panel 100. That is, the display device according to the embodiment of the present invention may operate only one channel of the converter 300 or alternately operate two channels thereof according to the load. In this case the load may be dispersed, thereby improving power consumption.

According to the embodiments of the present invention, even it is possible to minimize constraints on the cable length and therefore, more freely install the display body and the housing which are separate from each other, thereby improving usability since it is possible to supply power to the panel at the driving voltage of the panel using the converter when a voltage drop occurs in the cable.

In addition, since the power voltage passing through the cable is stepped up to be higher than the driving voltage of the panel, it is possible to reduce the current flowing through the cable, thereby minimizing constraints on the thickness of the cable.

In addition, the channels formed in the converter selectively operate according to the current supplied to the panel, thereby improving the efficiency of the converter and the power consumption.

In addition, the converter includes a plurality of coils, each of which has a smaller capacity but a thinner thickness, instead of a single coil having a large capacity but a thick thickness, thereby minimizing the thickness of the display body. In this case, the heat radiating effect can be enhanced by arranging the plurality of coils so as not to be side-by-side.

The above description is merely illustrative of the technical idea of the present invention, and various modifications and changes may be made thereto by those skilled in the art without departing from the essential characteristics of the present invention.

Therefore, the embodiments of the present invention are not intended to limit the technical spirit of the present invention but to illustrate the technical idea of the present invention, and the technical spirit of the present invention is not limited by these embodiments.

The scope of protection of the present invention should be interpreted by the appending claims, and all technical ideas within the scope of equivalents should be construed as falling within the scope of the present invention.

What is claimed is:

1. A display device, comprising:
   a display body including a panel;
   a housing spaced apart from the display body to transmit or receive a signal to or from the display body, wherein the housing comprises a control unit; and a cable configured to connect the display body and the housing, wherein the display body further includes a converter configured to convert power supplied from the housing via the cable into driving power for the panel, wherein the converter is formed with a plurality of channels to which converted power is output such that a number of the plurality of channels selectively operate according to a load of the panel, wherein the control unit is configured to determine a number of operation channels among the plurality of channels according to a current supplied to the panel.

2. The display device of claim 1, wherein the housing supplies power to the display body at a first voltage, and wherein the converter converts the first voltage into a second voltage lower than the first voltage and supplies power to the panel at the second voltage.

3. The display device of claim 2, wherein the first voltage is 35 V or more, wherein the second voltage is in a range of 20 V or more to 25 V or less.

4. The display device of claim 3, wherein the first voltage is 50 V or more.

5. The display device of claim 1, wherein the housing includes a power supply unit configured to supply power to the display body;

the control unit is further configured to allow an input image to be output to the panel; and a housing connector connected to the cable.

6. The display device of claim 5, wherein the power supply unit boosts voltage of power supplied to the display body to a voltage which is higher than a driving voltage of the panel and supplies boosted voltage to the housing connector.

7. The display device of claim 1, wherein the display body further includes a body connector connected to the cable to receive power and an image signal, and a timing controller configured to receive power obtained through conversion by the converter and the image signal.

8. The display device of claim 1, wherein the converter performs conversion of power through Pulse Width Modulation (PWM) control.

9. The display device of claim 1, wherein a single channel operates when the current supplied to the panel is less than a reference current, and wherein two channels operate in an interleaved scheme when the current supplied to the panel is equal to or greater than the reference current.

10. The display device of claim 9, wherein the housing further includes a memory configured to store a table in which ranges of a current supplied to the panel are mapped to numbers of operating channels.

11. The display device of claim 1, wherein the display body includes a plurality of converters.

12. The display device of claim 1, wherein the converter includes at least one coil.

13. The display device of claim 12, wherein, when the converter includes a plurality of coils connected in series to one another, the plurality of coils are arranged not to be side-by-side to one another.

* * * * *